United States Patent [19]

Inuta et al.

[11] Patent Number: 4,750,505
[45] Date of Patent: Jun. 14, 1988

[54] APPARATUS FOR PROCESSING WAFERS AND THE LIKE

[75] Inventors: Kazuo Inuta, Shiga; Akira Watanabe, Hiroshima, both of Japan

[73] Assignee: Dainippon Screen Mfg. Co., Ltd., Kyoto, Japan

[21] Appl. No.: 856,938

[22] Filed: Apr. 25, 1986

[30] Foreign Application Priority Data

Apr. 26, 1985 [JP] Japan .............................. 60-63546[U]

[51] Int. Cl.⁴ ................................................ B08B 3/02
[52] U.S. Cl. ...................................... 134/153; 134/95; 134/158; 134/182; 15/302; 15/310
[58] Field of Search ................... 134/94, 95, 102, 104, 134/109, 133, 153, 155, 158, 182; 15/303, 310, 302; 34/187

[56] References Cited

U.S. PATENT DOCUMENTS

| | | | |
|---|---|---|---|
| 2,893,410 | 7/1959 | Frekko | 134/153 |
| 4,316,750 | 2/1982 | Gengler | 134/104 |
| 4,421,131 | 12/1983 | Auvil, Jr. | 134/104 |
| 4,445,281 | 5/1984 | Aigoo | 34/187 |

FOREIGN PATENT DOCUMENTS 0012576  1/1977  Japan .................................. 134/153

Primary Examiner—Harvey C. Hornsby
Assistant Examiner—Corinne M. Reinckens
Attorney, Agent, or Firm—Lowe, Price, Leblanc, Becker & Shur

[57] ABSTRACT

An apparatus for processing semiconductor substrates (i.e., wafers) or the like by rotation of the same. The apparatus includes: a housing which defines a processing chamber therein; and an exhaust duct connected to the lower side portion of the chamber. A rotary member is rotatably mounted in the chamber, on which a plurality of wafers to be processed are held. At the upper side portion within the chamber an auxiliary chamber is provided. Undesired objects, such as water remaining on the wafers and vapor and dirts sprung from the wafers, are effectively expelled from the chamber, through both the exhaust duct and the auxiliary chamber.

9 Claims, 2 Drawing Sheets

APPARATUS FOR PROCESSING WAFERS AND THE LIKE

BACKGROUND OF THE INVENTION

The present invention relates to an improvement of an apparatus for processing semiconductor substrates (hereinafter referred to as wafers), or any other plates, such as glass plates. More particularly, the present invention relates to an improvement of an apparatus for use, wherein the apparatus is adapted for use in a rinse processing and a dry processing.

To dry wafers by rotation thereof, there have been several proposals, among which Japanese patent application Laid-Open No. 57-183038 shows such an apparatus as depicted in FIG. 4, which is discussed in detail below.

The well known apparatus depicted in FIG. 4 comprises a housing 101 which defines a drying chamber 102 therein. A rotary member 106 is rotatably provided in the chamber 102, and is fixedly supported by a shaft 109. On the rotary member 106 a couple of wafer cases 107 are detachably mounted, wafers to be processed being stored horizontally in the wafer cases. A lid 103 is provided on the top of the housing 101, the lid 103 having an opening 104 through which dry air is introduced into the chamber. The conventional apparatus further comprises a cylindrical inner wall 108 extending downwardly from the lid 103 up to slightly below the upper margin of the rotary member 106 so that the upper margin is surrounded by the inner wall 108. When a dry processing is carried out, the rotary member 107 in which wafers to be processed are stored is rotated at high speed, during which dry air is introduced into the chamber, through the opening 104. The dry air introduced is used for drying the wafers, and thus-used air is expelled through an exhaust duct 105 which is pneumatically connected to the chamber. The flow of air is depicted by arrows in FIG. 4.

In the conventional apparatus as mentioned above the cylindrical inner wall 108 is intended to function as a barrier to prevent undesirable water and dirt from entering into the inside of the rotary member 106, that is, from contaminating the wafers to be processed thereby.

However, there remains a problem that eddy flows denoted by the numeral 103a may be caused in the upper peripheral portion within the chamber denoted by the letter C, where desirable water and dirt expelled from the rotary member 106 will accumulate and disadvantageously enter into the inside of the rotary member through a space between the inner wall 108 and the rotary member, because the rotation thereof causes a negative pressure inside the member 106. The wafers to be processed and stored in the cases 107 can be contaminated and spoiled.

OBJECTS AND SUMMARY OF THE INVENTION

The present invention is directed toward solving the aforementioned problem of the conventional apparatus. Specifically, it is a primary object of this invention to provide an improved apparatus for processing wafers by rotation thereof, so as to avoid possible contamination of the wafers, and so as to secure speedy and safe processing thereof.

Other objects and advantages of the present invention will become apparent from the detailed description of preferred embodiments taken in conjunction with the accompanying drawings. It should be understood, however, that the description and specific embodiments be given by way of illustration only, since various changes and modifications within the spirit and scope of the invention will become apparent to those skilled in the art the present invention pertains.

To achieve the foregoing object, there is provided, in one embodiment of the present invention, an apparatus for processing wafers or the like by rotation thereof. This apparatus comprises: a housing which defines a processing chamber therein; an exhaust duct connected to the lower side portion of the chamber; a rotary member rotatably mounted within the chamber, on which a plurality of wafers to be processed are held; barrier means for preventing undesired objects from entering into the inside of the rotary member, the barrier extending downwardly up to immediately adjacent to the rotary member; a lid member openably mounted at the top of the housing, the lid member having an opening for introducing clean air or the like into the chamber; an auxiliary chamber provided at the upper peripheral portion within the processing chamber; and an auxiliary duct connected to the auxiliary chamber. The auxiliary chamber is preferably provided at the position outside the barrier means and within the outer wall of the processing chamber.

The barrier means preferably comprises a cylindrical or partially conical plate mounted immediately above the rotary member.

On the rotary member at least one wafer cassette holder is pivotally mounted, the holder being adapted to receive a wafer cassette in which a plurality of wafers to be processed are stored. The holder is movable from the first position to the second position, where a wafer cassette is loaded in the holder.

Preferably, a circular plate is mounted on the top of the rotary member, by which undesired objects are prevented from entering into the inside of the rotary member. Clean air is introduced into the inside of the rotary member through the opening of the circular plate.

An air filter is preferably provided immediately beneath the lid member.

A conduit substantially vertically extends at the center of the rotary member, at the peripheral surface of which fine holes are provided so as to supply desired solution or gas to the wafers.

DETAILED DESCRIPTION

Figure 1:
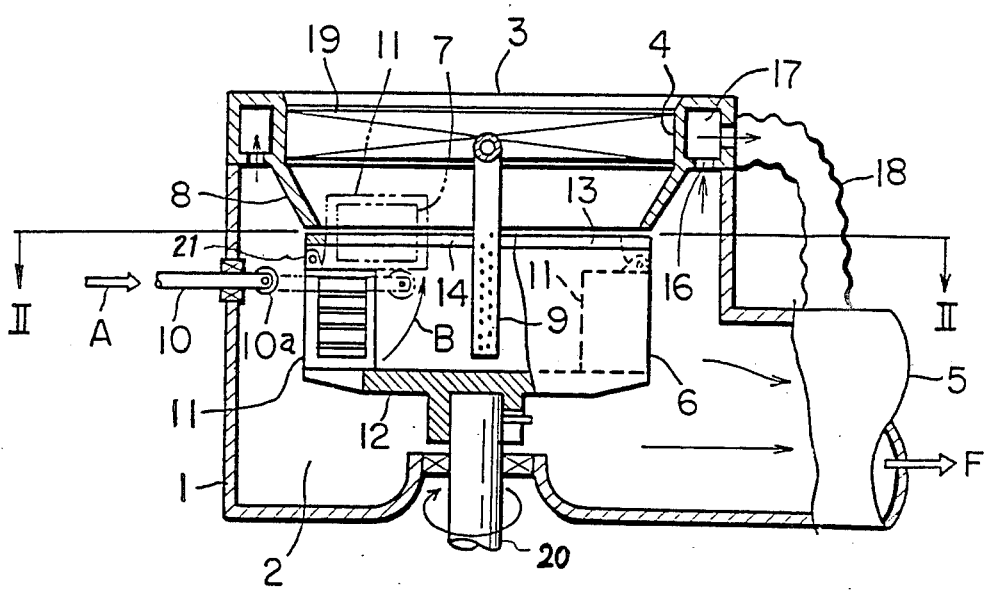
FIG. 1 is a vertical cross-section of a first embodiment of the present invention.
Figure 2:
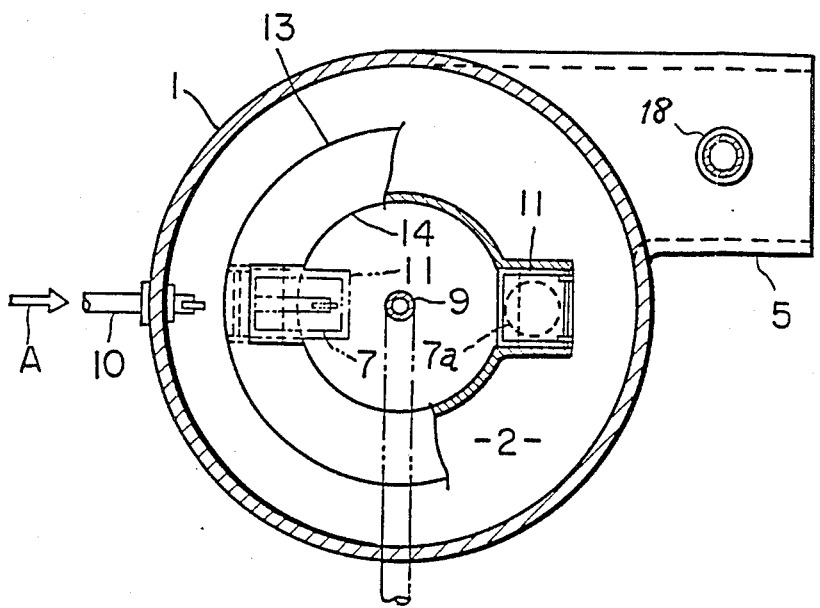
FIG. 2 is a cross-sectional plan view taken along the line II—II in FIG. 1.

Referring to FIGS. 1 and 2, the apparatus according to the present invention comprises a housing 1 which defines a drying chamber 2 therein. A rotary member 6 is rotatably provided in the chamber 2, and is fixedly coupled to a rotary shaft 20 which is connected in turn to a motor (not shown), thereby rotation of the rotary member 6 is carried out. An exhaust duct 5 is pneumatically connected to the lower side portion of the chamber 2, through which undesired objects, such as water or vapor and dirt from wafers to be processed, are expelled as shown by an arrow F by means of a suction pump (not shown) which is connected at the other end of the exhaust duct.

A couple of wafer cassette holders 11 adaptable to receive a wafer cassette 7 respectively therein are pivotably mounted at the opposite sides of the rotary member 6 by means of hinges 21. In respective wafer cassette 7 there are stored a plurality of wafers to be processed. On the top of the rotary member 6 there is provided a circular plate 13 so as to prevent undesired objects from entering into the inside of the rotary member. The circular plate 13 has a circular opening 14, as clearly shown in FIG. 2, to allow the introduction of clean air therethrough, and has a couple of notches at the positions corresponding to the cassette holders 11 to allow the holders to rise therethrough.

On the outer side wall of the housing 1, there is provided a lever 10 having a contact member 10a at the end thereof, the lever being movable in horizontal directions, by which the cassette holder 11 pivots as shown by an arrow B.

On the top of the housing 1 there is provided a circular lid member 3 which is openably mounted by hinges (not shown). The open-close operation of the lid member 3 is performed by a pneumatic cylinder (not shown). The lid member 3 has an opening to introduce clean air into the chamber 2 therethrough. Immediately beneath the opening of the lid member 3 an air filter 19 is provided to clean the air to be introduced.

A partial conical plate 8 extends downwardly to immediately above the rotary member. It is especially preferable that the lower end of the plate 8 comes near the upper margin of the rotary member 6, i.e., circular plate 13, as far as possible, so that undesired objects are prevented from entering into the inside of the rotary member through the space therebetween. As can be apparently understood, the partial conical plate 8 functions as a primary barrier against the undesired objects, and on the other hand the circular plate 13 functions as an auxiliary barrier.

A rinse conduit 9 is provided at the center of the rotary member 6, the conduit substantially vertically extending therein. At the peripheral surface of the conduit 9, fine holes are radially provided through which rinse solution is supplied to the wafers stored in the wafer cassette 7. If desired, the conduit 9 is available for use in supplying inert gas by means of an appropriate switching member (not shown).

In the upper peripheral portion within the chamber 2 there is provided an auxiliary chamber 17 for collecting the undesired objects therein, the auxiliary chamber 17 being pneumatically connected to the chamber 2 and on the other hand to an auxiliary duct 18 which in turn is connected to the exhaust duct 5.

In operation, a wafer cassette in which a plurality of wafers to be processed is stored is fed to a predetermined position just above the lid member 3. The lid member 3 is opened by a pneumatic cylinder (not shown), and simultaneously the lever 10 moves in the direction shown by an arrow A, the contact member 10a of the lever pushing the cassette holder 11 as the lever moves. Then the cassette holder 11 is raised upwardly as shown by an arrow B. At the position depicted by two-dashed lines the cassette holder 11 receives a wafer cassette 7 therein. After that, the lever 10 moves inversely, thereby the cassette holder returns back to the initial position thereof. Then the rotary member 6 is rotated 180 degrees. Then, the aforementioned operation is repeated, so that a wafer cassette 7 is loaded in the respective cassette holder 11. After that, the lid member 3 is closed, and rotation of the rotary member 6 is commenced.

Rinse solution is supplied through the fine holes of the conduit 9 to the wafers 7a for a predetermined period. Clean air is introduced through the opening of the lid member 3, hence through the air filter 19, into the chamber 2. The wafers stored in the cassettes 7 are thus rinsed, and used rinse solution and introduced air are forced outwardly from the rotary member. The used solution and introduced air may be substantially expelled through the exhaust duct 5. Remaining undesired objects, such as fine solution drops or vapor and dirt from the wafers, are collected in the auxiliary chamber 17 to be exhausted through the auxiliary duct 18, hence through the exhaust duct 5.

After rinse processing as mentioned above, the solution supply from the conduit 9 is stopped, while rotation of the rotary member 6 continues. The solution or water remaining on wafer surfaces is shaken off by the centrifugal force of the rotary member 6. Simultaneously, since clean dry air is introduced through the opening of the lid member 3 and is supplied to the wafers, the dry processing of the wafers is facilitated.

During the dry processing, undesired objects sprung from the rotary member 6 are substantially expelled through the exhaust duct 5, and are partially collected in the auxiliary chamber 17.

During the dry processing as well as the rinse processing, undesired objects may be apt to enter the inside of the rotary member 6. However, since the barrier plate 8 and the auxiliary barrier plate 13 are provided against the entrance of undesired objects, they are completely expelled to the auxiliary chamber 17.

Accordingly, the wafers stored in the cassettes 7 are cleanly rinsed and dried without any contamination and spoilage of the wafers.

Figure 3:
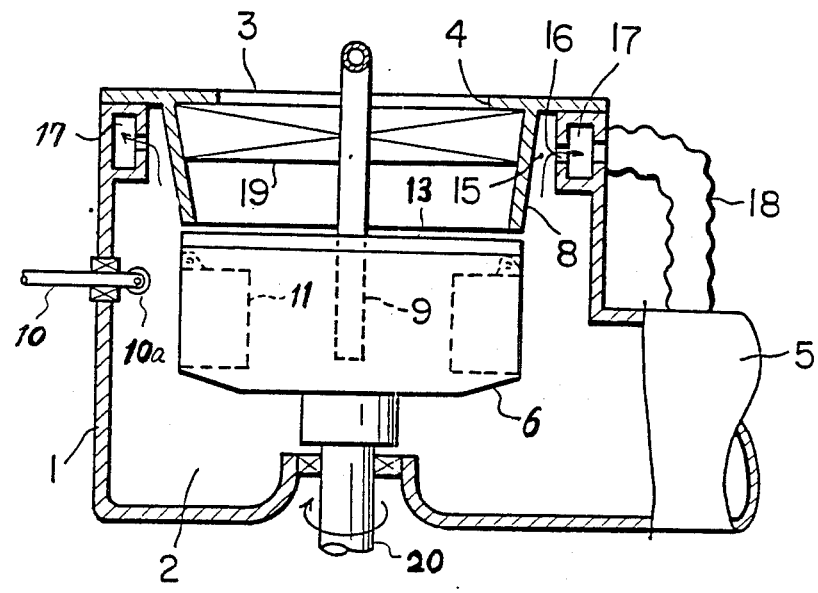
FIG. 3 is a vertical cross-section showing a second embodiment of the present invention.
Figure 4:
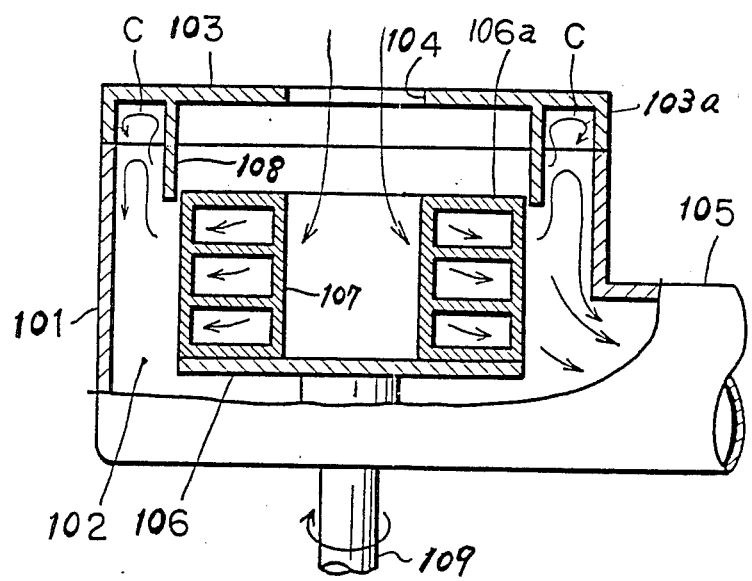
FIG. 4 is a vertical cross-section showing a conventional apparatus.

FIG. 3 shows another embodiment of the present invention, wherein like reference numerals and letters designate like or corresponding parts of the embodiment shown in FIGS. 1 and 2.

In FIG. 3 the auxiliary chamber 17 has a tilt 16 facing to the conical barrier plate 8, and is separate from the lid member 3. The slit pneumatically communicates between the chamber 2 and the auxiliary chamber 17. The conduit 9 provided at the center of the rotary member 6 extends vertically up to the outside of the lid member 3, and is fixedly supported by means of a supporting member (not shown).

In the aforementioned embodiments, the auxiliary duct 18 is connected to the exhaust duct 5. However, it is apparent that the auxiliary duct may be directly connected to another suction pump (not shown).

Of course, the number of cassette holder may be increased, if desired.

In the illustrated embodiments, the barrier plate 8 is integral with lid member 3, but it may be mounted to the housing body.

We claim:

1. In an apparatus for processing wafers or the like by rotation of the same, including a housing which defines a processing chamber therein; an exhaust duct connected to the lower side portion of said chamber; a rotary member rotatably mounted within said chamber, on which a plurality of wafers to be processed are held;

a barrier means for preventing undesired objects from entering into the inside of said rotary member, said barrier means extending downwardly immediately adjacent to an upper end of said rotary member; and a lid member having an opening for introducing clean air or the like into said chamber, the improvement comprising:

an auxiliary chamber integrally formed adjacent a lower inner peripheral portion of said lid member, said auxiliary chamber having an opening formed in the circumferential direction thereof for introducing thereinto an eddy air flow caused in an upper peripheral portion within said processing chamber, and any entrained material carried by said eddy air flow during the operation of said apparatus; and an auxiliary duct communicating with said auxiliary chamber receiving the eddy air flow to exhaust air and any entrained material carried therewith, therethrough.

2. The apparatus set forth in claim 1, further comprising:

at least one wafer cassette holder pivotably mounted on said rotary member, said holder being adaptable to receive a wafer cassette in which a plurality of wafers to be processed are stored; and means for pivotably moving said wafer cassette holder from a first position to a second position, at the second position said wafer cassette holder receiving said wafer cassette.

3. The apparatus set force in claim 2, further comprising:

a circular plate provided on the top of said rotary member, said circular plate having an opening thereon, through which clean air is introduced to said rotary member.

4. The apparatus set force in claim 1, further comprising:

an air filter provided immediately beneath said opening of said lid member.

5. The apparatus set force in claim 1, further comprising:

a conduit vertically extending at the center of said rotary member; and fine holes provided on the peripheral surface of said conduit, through which a desired solution or gas is supplied to the wafers to be processed.

6. In an apparatus for processing wafers or the like by rotation of the same, including a housing which defines a processing chamber therein, an exhaust duct connected to the lower side portion of said chamber; a rotary member rotatably mounted within said chamber, on which a plurality of wafers to be processed are held; barrier means for preventing undesired objects from entering into the inside of said rotary member, said barrier means extending downwardly up to immediately adjacent to said rotary member; and a lid member having an opening for introducing clean air or the like into said chamber, an improvement comprising:

an auxiliary chamber provided at the upper side portion od said processing chamber, said auxiliary chamber communicating with said processing chamber;

an auxiliary duct communicating with said auxiliary chamber, through which undesired objects are exhausted;

at least one wafer cassette holder pivotably mounted on said rotary member, said holder being adaptable to receive a wafer cassette in which a plurality of wafers to be processed are stored;

means for pivotably moving said holder from a first position to a second position, at the second position said holder receiving said cassette;

a conduit vertically extending at the center of said rotary member; and fine holes provided on the peripheral surface of said conduit, through which desired solution or gas is supplied to the wafers to be processed.

7. In an apparatus for processing wafers or the like by rotation of the same, including a housing which defines a processing chamber therein; an exhaust duct connected to a lower side portion of said chamber; a rotary member rotatably mounted within said chamber, on which a plurality of wafers to be processed are held; barrier means for preventing undesired objects from entering into the inside of said rotary chamber, said barrier means extending downwardly to end immediately adjacent an upper end of said rotary member; and a lid member having an opening for introducing clean air or the like into said chamber, the improvement comprising:

a downwardly depending conical external surface of said barrier means having a diameter at its lowest portion coaxial with and not larger than the adjacent upper end of said rotating member;

an auxiliary chamber provided at an upper internal peripheral portion within said processing chamber, said auxiliary chamber communicating with said processing chamber at a level higher than the upper end of said rotating member to receive any entrained material carried by air flow passing through said chamber during operation of said apparatus, the conical external surface of said barrier means facilitating said flow of entrained material into said auxiliary chamber for exhaustion therefrom; and an auxiliary duct communicating with said auxiliary chamber for exhausting air and any entrained material carried therewith therethrough.

8. An apparatus according to claim 7, wherein:

the flow of air and any entrained material carried therewith is received in said auxiliary chamber primarily in a horizontal radially outward direction.

9. Apparatus according to claim 7, wherein:

the flow of air and any entrained material carried therewith is received in said auxiliary chamber primarily in a vertically radially outward direction.

* * * * *